(12) United States Patent
Chu et al.

(10) Patent No.: US 6,825,691 B1
(45) Date of Patent: Nov. 30, 2004

(54) APPARATUS AND METHOD FOR A RADIATION RESISTANT LATCH WITH INTEGRATED SCAN

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 10/455,163

(22) Filed: Jun. 5, 2003

(51) Int. Cl.[7] .................... H03K 19/173; G11C 11/412
(52) U.S. Cl. .................... 326/46; 326/95; 327/144; 365/156; 365/189.05
(58) Field of Search .................... 326/46, 95, 98; 327/144; 365/156, 194, 189.05

(56) References Cited

U.S. PATENT DOCUMENTS

| | | | | |
|---|---|---|---|---|
| 5,504,703 A | * | 4/1996 | Bansal | ........................ 365/156 |
| 5,896,046 A | | 4/1999 | Bjorksten et al. | ............. 326/98 |
| 6,629,276 B1 | * | 9/2003 | Hoffman et al. | ............ 714/726 |

OTHER PUBLICATIONS

"Twice Redundant Radiation Hardened Latch," IBM Technical Disclosure Bulletin, vol. 30, No. 8, Jan. 1988, pp. 248–249.

D.B. Eardley, "Latch Circuit Insensitive to Disturb by Alpha Particles," IBM Technical Dislcosure Bulletin, vol. 24, No. 12, May 1982, pp. 6461–6462.

"On–Chip Logic Enhancements for Test of Error Checking and Correcting Related Functions in On–Card Applications," IBM Technical Disclosure Bulletin, vol. 30, No. 12, May 1988, pp. 247–250.

* cited by examiner

*Primary Examiner*—Daniel D. Chang
(74) *Attorney, Agent, or Firm*—Mark E. McBurney; Anthony V. S. England (57) ABSTRACT

According to one form, a latch has an output node and sublatches. The sublatches each have an output node coupled to input circuitry and feedback circuitry coupled to the sublatch's output node for reinforcing an output signal of the sublatch. The sublatches are operable to receive a data signal at their respective input circuitry and to generate output signals on their respective output nodes. At least one sublatch output node is coupled to the latch output node. The output nodes of other ones of the sublatches are connected in the latch such that if any one of the sublatches is subjected to a radiation induced erroneous change of state the output signals of the other sublatches reduce an effect of the change on the latch output signal. The latch also includes a number of scanning-mode control switches coupled to ones of the sublatches for scanning data in or out.

20 Claims, 5 Drawing Sheets

APPARATUS AND METHOD FOR A RADIATION RESISTANT LATCH WITH INTEGRATED SCAN

RELATED APPLICATION

This application is related to the following application filed on the same date as the present application and hereby incorporated herein by reference: (Ser. No. 10/455,161) "APPARATUS AND METHOD FOR A RADIATION RESISTANT LATCH."

BACKGROUND

1. Field of the Invention

The present invention relates to latch circuitry and more particularly to radiation resistant latch circuitry with integrated scanning capability.

2. Related Art

Various latching circuits are known for isolating logic circuitry stages, such as for ensuring orderly evaluation without corrupting data from one logic stage to the next, for avoiding races, and for other timing purposes. In complicated logic circuitry, such as that of a microprocessor or an application specific integrated circuit, it is known to "scan" data in and out of the logic circuitry latches in order to verify proper operation of the circuitry. It is also known to integrate scanning capability into latches. For example, U.S. Pat. No. 5,896,046, "Latch structure for ripple domino logic," Apr. 20, 1999, Bjorksten et al., FIG. 2 discloses a domino latch with integrated scanning, and is hereby incorporated herein by reference.

Figure 1:
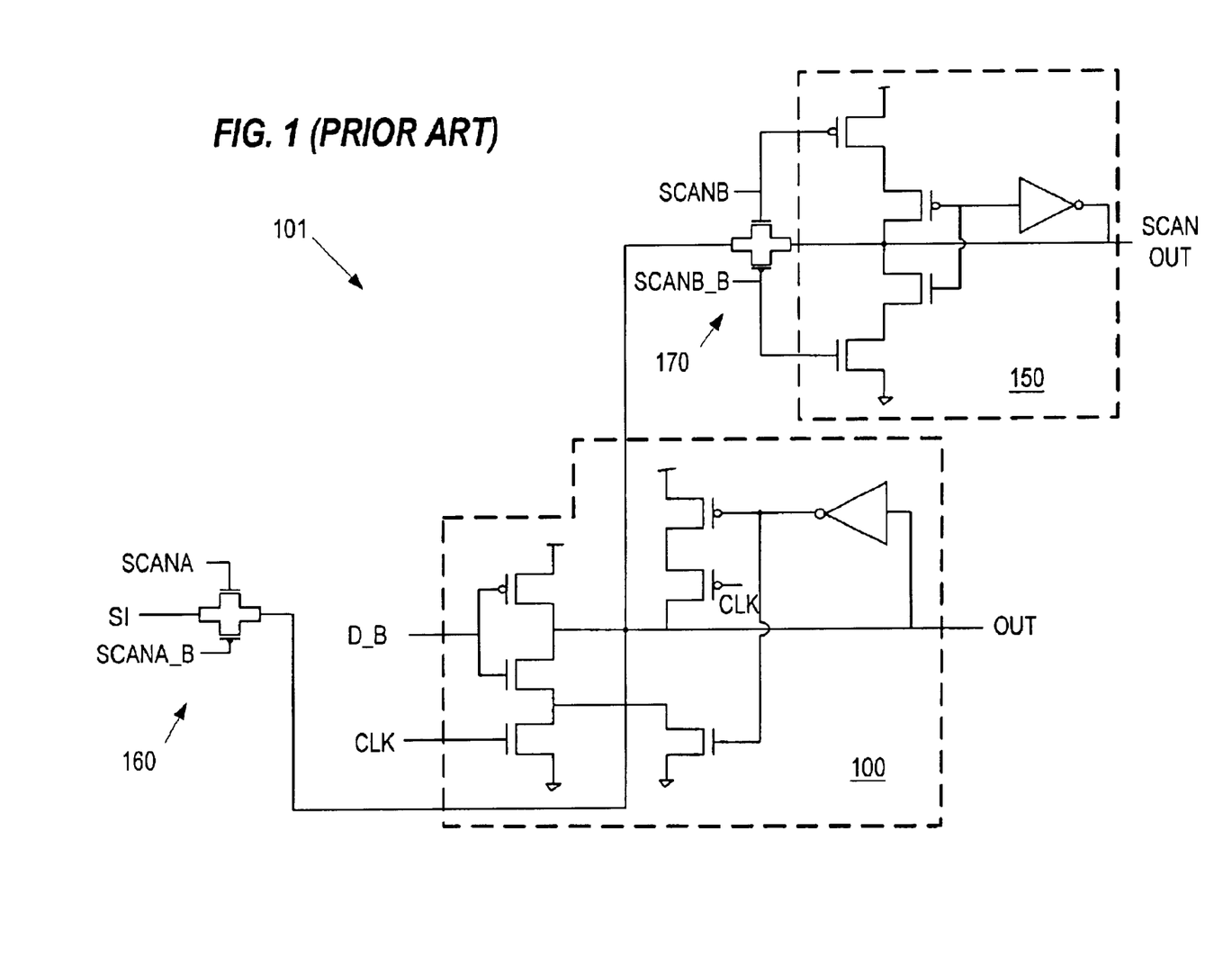
FIG. 1 illustrates a domino latch circuit that has a scanning sublatch, according to the prior art.

Referring now to FIG. 1 herein, a latch 101 with integrated scanning is illustrated. Latch 101 is a simplified version of that disclosed by Bjorksten et al. The latch 101 includes conventional latch circuitry 100, a first scanning-mode control switch 160, consisting of a PFET/NFET pair of passgates, coupled to the output node of the latch circuitry 100, and a second scanning-mode control switch 170 interposed between the output node of the latch circuitry 100 and a scanning-mode latch 150.

One problem with prior art latches is that cosmic rays and alpha particles can collide with a latch node and cause it and an output to switch states erroneously. The related patent application, cross-referenced above, discloses improvements in radiation immunity for latches, however, it does not address latches with integrated scanning such as latch 101 of FIG. 1 suggested by Bjorksten et al. Therefore a need exists for improvements in radiation immunity for latches with integrated scanning.

SUMMARY OF THE INVENTION

The foregoing need is addressed in the present invention. In one form of the invention, a radiation resistant latch has an overall output node, and first, second and third sublatches. The sublatches each have input circuitry, an output node coupled to the sublatch's input circuitry and feedback circuitry coupled to the sublatch's output node for reinforcing an output signal of the sublatch. The sublatches are operable to receive a data signal at their respective input circuitry and responsively generate binary-state output signals on their respective output nodes. The output node of at least the first sublatch is coupled to the latch output node. The output nodes of the second and third sublatches are respectively connected in the latch such that if any one of the three sublatches is subjected to a radiation induced erroneous change of state, the output signals of the other two sublatches reduce an effect of the change on an overall output signal for the latch, providing improved radiation immunity. The latch also includes a number of scanning-mode control switches coupled to ones of the sublatches for scanning data into the latch.

Additional objects, advantages, aspects and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

The above cross-referenced and incorporated patent application discloses latches that have redundant sublatches for improving immunity to radiation events. The present patent application discloses how a number of scanning-mode control switches are arranged to interconnect respective sublatches in such a radiation resistant latch so that data may be scanned in or out.

Figure 2A:
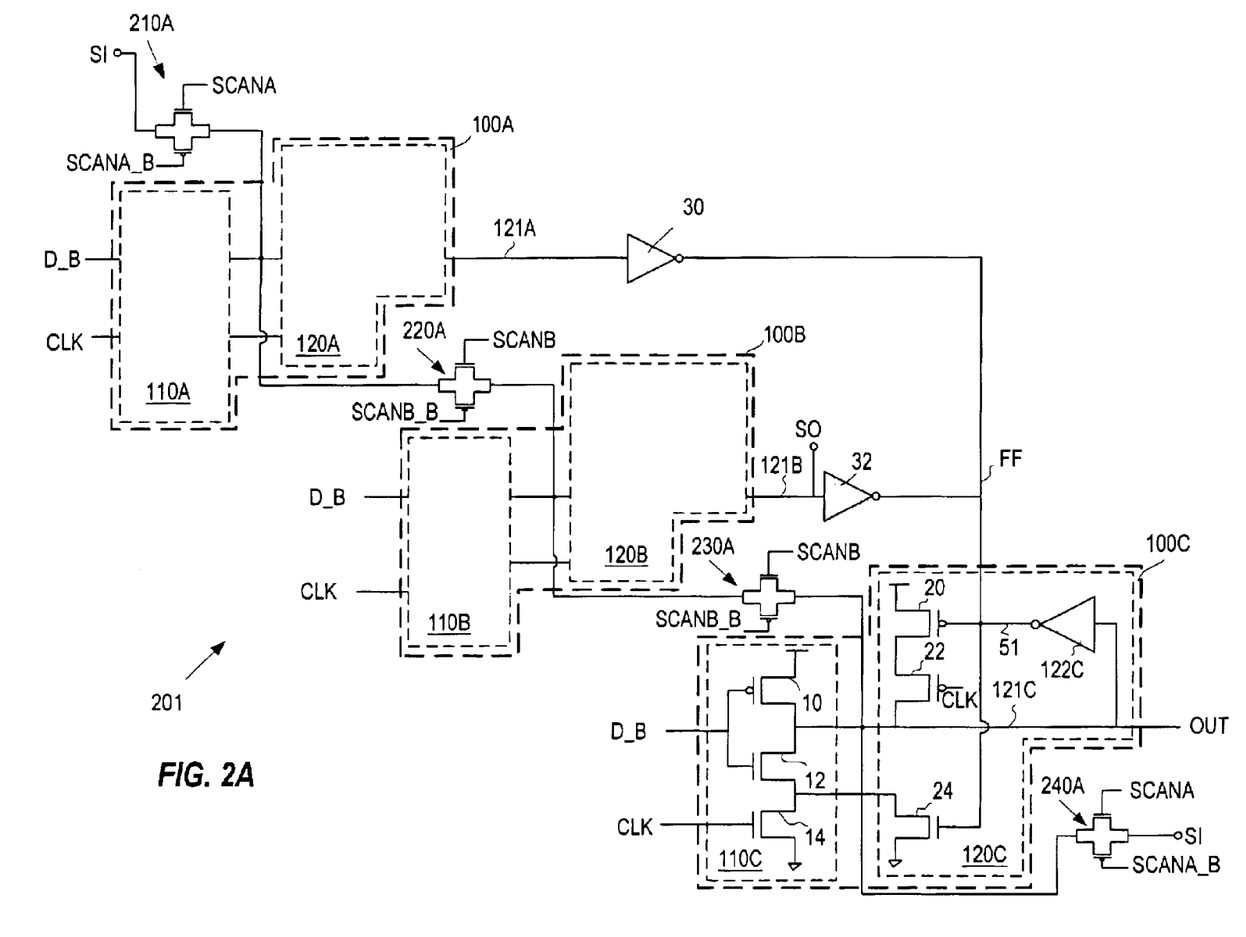
FIGS. 2A and 2B illustrate latch circuits having twice redundant sublatches for improved radiation immunity in which the redundant sublatches are also interconnected for use as scanning sublatches, according to an embodiment of the present invention.

Referring now to FIG. 2A, a domino latch 201 is shown, according to an embodiment of the present invention. The latch 201 has two operating modes, a normal operation mode and a scanning mode. In FIG. 2A, as in other FIG's herein, it is assumed that in the normal operation mode the data signal comes from a preceding logic stage.

As to normal operation, for domino logic such as latch 201, during an evaluate phase the first and second scanning control signals SCANA and SCANB are driven low and their complements SCANA_B and SCANB_B are held high so that the scanning control switches 210A, 220A, 230A and 240A are nonconductive and scan data is not written into the latch 201. Also, during this evaluate phase the clock signal CLK goes high and the data signal D_B is held high or driven low by the preceding logic stage. With the CLK signal high, the latch 201 permits the D_B signal to drive its latch output high or low, as the case may be. Then, during a precharge phase, the data signal D_B goes high and the clk signal CLK goes low. According to the arrangement shown for circuit 201, with the data and clock signals in their precharge states feedback through inverters such as inverter 122C explicitly shown in sublatch 100C keep the latch 201 output at the high or low state to which it was driven during evaluation, as the case may be, regardless of whether the output was driven high or low during evaluation.

In contrast, during the scanning mode of operation of latch 201 the first and second scanning control signals SCANA and SCANB are selectively held high and their complements SCANA_B and SCANB_B are driven low according to a particular sequence so that the scanning control switches 210A, 220A, 230A and 240A are conductive and scan data is selectively staged into the latch 201, as will be further described herein.

Normal operation aspects. Before a further description more related to scanning, those aspects of latch 201 which relate more to normal operation of the latch 201 are now described. Much of this description relating to normal operation is of greater significance to the related patent application. Accordingly, the following description is somewhat abbreviated by comparison. For further details of structure and function concerning operation of latch 201 in the normal mode refer to the related application.

Latch 201 includes three domino latches 100A, 100B and 100C, which may be referred to herein as "sublatches," whereas latch 201 may be referred to herein as the "overall" latch. The three sublatches 100A, 100B and 100C are all the same and their internal details are shown for circuit 100C. Circuitry 120C is referred to herein as "feedback/feed forward" circuitry, or more simply as "feedback" circuitry. The outputs of the two feed forward sublatches 100A and 100B are coupled to circuitry 120C of third sublatch 100C. The domino sublatch 100C, in turn, has its output node 121C coupled to the overall radiation resistant latch 201 output node OUT. In another manner of speaking, since node 121C is directly coupled to the overall output node OUT with no device interposed there between, it may be said that node 121C provides the overall output node OUT.

Each of the sublatches 100A, 100B and 100C is coupled to the data input D_B and clock input CLK, for receiving signals of the same name. Sublatch 100A output node 121A provides a latch node that is coupled at FF to feedback/feed forward circuitry 120C via inverter 30. (Inverter 30 may be considered to be part of sublatch 100A, and may accordingly be referred to herein as an output inverter of the sublatch 100A.) Similarly, output node 121B provides a latch node that is coupled at FF to feedback/feed forward circuitry 120C via inverter 32, which may be considered to be part of sublatch 100B.

The internal circuitry of sublatch circuit 100C is shown in FIG. 2A to reveal the location of the feed forward connection FF of the outputs of inverters 30 and 32 to feedback/feed forward node 51 within stage 120C, and to show the interrelationship and operation of various parts. The binary output signal from the output node OUT is fed back by feedback/feed forward circuitry 120C through inverter 122C, which has its output coupled to node 51 that is common to the gates of pull-up transistor 20 and pull down transistor 24. In this manner, during the precharge interval when the data signal D_B is high and the clock signal CLK is low the signal on the output node OUT will turn on the pull-up transistor 20 if the node OUT was driven high during the evaluate interval, feeding Vcc back to node OUT through transistors 20 and 22 to reinforce the node's high state, or will turn on the pull down transistor 24 if the node OUT was driven low during evaluate, feeding ground back to node OUT through transistors 12 and 24 to reinforce the node's high state. Thus, it should be appreciated that transistors 20 and 24 act as an inverter when enabled by either transistor 22 or transistor 12 being turned on. That is, when enabled transistor 20 switches Vcc to the output node 121C responsive to a low signal on the feedback node 51 or else transistor 24 switches ground to the output node 121C responsive to a high signal on the feedback node 51.

Likewise, the outputs 121A and 121B of circuits 100A and 100B, respectively, are driven to the same state as that of node OUT during evaluate. Thus, the outputs of inverters 30 and 32 also turn on transistor 20 or 24 during precharge, which effectively inverts the outputs of inverters 30 and 32, to reinforce the state of the node OUT. That is, with data high and clock low during precharge transistors 10 and 14 are turned off so that the feedback and feed forward signals on node 51 can reinforce the state of node OUT.

The combination of the two feed forward paths through sublatches 100A and 100B and their respective inverters 30 and 32, and the feedback path through inverter 122C provide three paths for reinforcing the state of the output node OUT. Consequently, if any one of the output nodes of the circuits 100A, 100B or 100C is subjected to a radiation induced erroneous change of state, the signals of the other two output nodes will prevent the pull-up transistor 20 or pull down transistor 24 of circuit 100C from being switched by the disparate signal, thereby preventing the feedback circuitry 120 from reinforcing the erroneous state so that output node OUT does not latch the erroneous state. Ideally, the output node OUT will be preventing from rising above or falling below, as the case may be, the threshold level of the state it had before the radiation event.

More specifically, if radiation causes the output signal of the first domino sublatch 100A or the output signal of the second domino sublatch 100B to change state, the output signal of the other one of the first or second domino sublatches 100A and 100B and the output signal of the third domino sublatch 100C tend to keep the output signal of the third domino sublatch from changing state by preventing the pull-up transistor 20 or pull down transistor 24 of circuit 100C from being switched by the disparate signal. And if radiation tends to cause the signal on the output node 121C of the third domino sublatch 100C to change state, the output signals of the first and second domino sublatches 100A and 100B tend to restore the output signal of the third sublatch 100C from the erroneous state. (It should also be noted that the output nodes of circuits 100A, 100B and 100C are preferably physically separated sufficiently so that no two of them are subject to the effects of a single radiation incident.)

Scanning. With regard to scanning aspects of latch 201, the ouput node 121B of the middle sublatch, sublatch 100B, provides a scanning output SO for the latch 201. The latch also has four scanning-mode control switches. The first scanning-mode control switch 210A consists of a pair of NFET/PFET passgates. The switch 210A has one set of conducting electrodes of the set of FET's coupled to the latch node, i.e., output node 121A, of first sublatch 100A. The switch 210A receives a scan data input signal SI on the other set of conducting electrodes of the set of FET's and receives a first scanning control signal SCANA (and its complement SCANA_B) on the gates of the FET's. The switch 210A selectively receives the scan data conductively to the node 121A, according to the control signals asserted on the gates of the switch 210A.

The latch 201 also has a second scanning-mode control switch 220A, also consisting of a pair of NFET/PFET passgates. The second scanning-mode control switch 220B couples the first sublatch 100A node 121A conductively to the second sublatch 100B latch node 121B, according to a second scanning control signal SCANB and its complement SCANB_B asserted on the gates of the switch 220A.

Likewise, the latch 201 has a third scanning-mode control switch 230A, also consisting of a pair of NFET/PFET passgates. In similar fashion, the third scanning-mode control switch 230A couples the second sublatch 100B node 121B conductively to the third sublatch 100C latch node 121C, according to control signals SCANB and SCANB_B asserted on the gates of the switch 230A.

Finally, the latch 201 has a fourth scanning-mode control switch 240A consisting of a pair of NFET/PFET passgates. The switch 240A has one set of conducting electrodes of the set of FET's coupled to the latch node 121C of third sublatch 100C. The switch 240A receives a scan data input signal SI on the other set of conducting electrodes of the set of FET's and receives the first scanning control signal SCANA (and its complement SCANA_B) on the gates of the FET's. The switch 240A selectively transmits the scan data conductively to the node 121C, according to the control signals asserted on the gates of the switch 240A.

The arrangement of FIG. 2A is subject to scanning operation as follows. During the scanning operation the clock signal CLK goes low and the data signal D_B is held high. Referring to sublatch 100C, it may be seen that with these signal states for CLK and D_B latch node 121C may be either driven to a low state or held at a high state through a scanning switch 240A or 230A and the feedback circuitry 120 will reinforce that state, tending to latch the state, either by turning on PFET 20 or NFET 24, as the case may be.

As is conventional, scanning data into the latch 201 is done in two phases. For latch 201, the first phase is referred to as the "SCANA" scan clock phase, and the second phase is the "SCANB" scan clock phase.

According to one sequence for scanning in data, in the first phase the first scanning-mode control signal SCANA is asserted (and it's complement SCANA_B is deasserted) and the second scanning-mode control signal SCANB is deasserted (and it's complement SCANB_B is asserted), thereby turning on the first scanning switch 210A and the fourth scanning switch 240A, which conductively couples the scanning data SI to nodes 121A and 121C, which latch and hold the data. Then, in the second phase, the first scanning-mode control signal SCANA is deasserted (complement asserted) and the second scanning-mode control signal SCANB is asserted (complement deasserted), which turns on switches 220A and 230A and conductively couples to node 121B the data latched in nodes 121A and 121C. At this point, after the SCANB phase of scanning, the data scanned in may be read at the scanning output SO.

Note that according to the above sequence latch 201 output node OUT sees at least ⅔ of the scanned in data signal level during scan clock phase SCANA. If it is desired for OUT to see the value of the scanned in data only after the scan clock phase SCANB, a different scanning sequence may be performed, according to which the SCANA signal is asserted (and its complement deasserted) in the first, i.e., SCANA, phase for only a selected one of the switches 210A or 240A and not the other one, thereby latching the scanned in value to only the selected one of the corresponding latch nodes 121A or 121C. For example, suppose that in the first phase only the scan switch 210A is turned on, so that the scanned in data is latched only into node 121A. Then, in the second scanning phase, the first scanning-mode control signal SCANA for both scan switch 210A and 240A is deasserted (complement asserted) and the second scanning-mode control signal SCANB is asserted (complement deasserted), which turns on switches 220A and 230A and conductively couples to node 121B and 121C the data that was just latched in node 121A. (Note that the switches 220A and 230A must be large enough so that the values in sublatches 100B and 100C are successfully overwritten in the second scanning phase. This may imply that drivers are included between sublatches, i.e., in series with switches 220A and 230A.) At this point, after the SCANB phase of scanning, the data scanned in may be read at the scanning output SO.

Figure 2B:
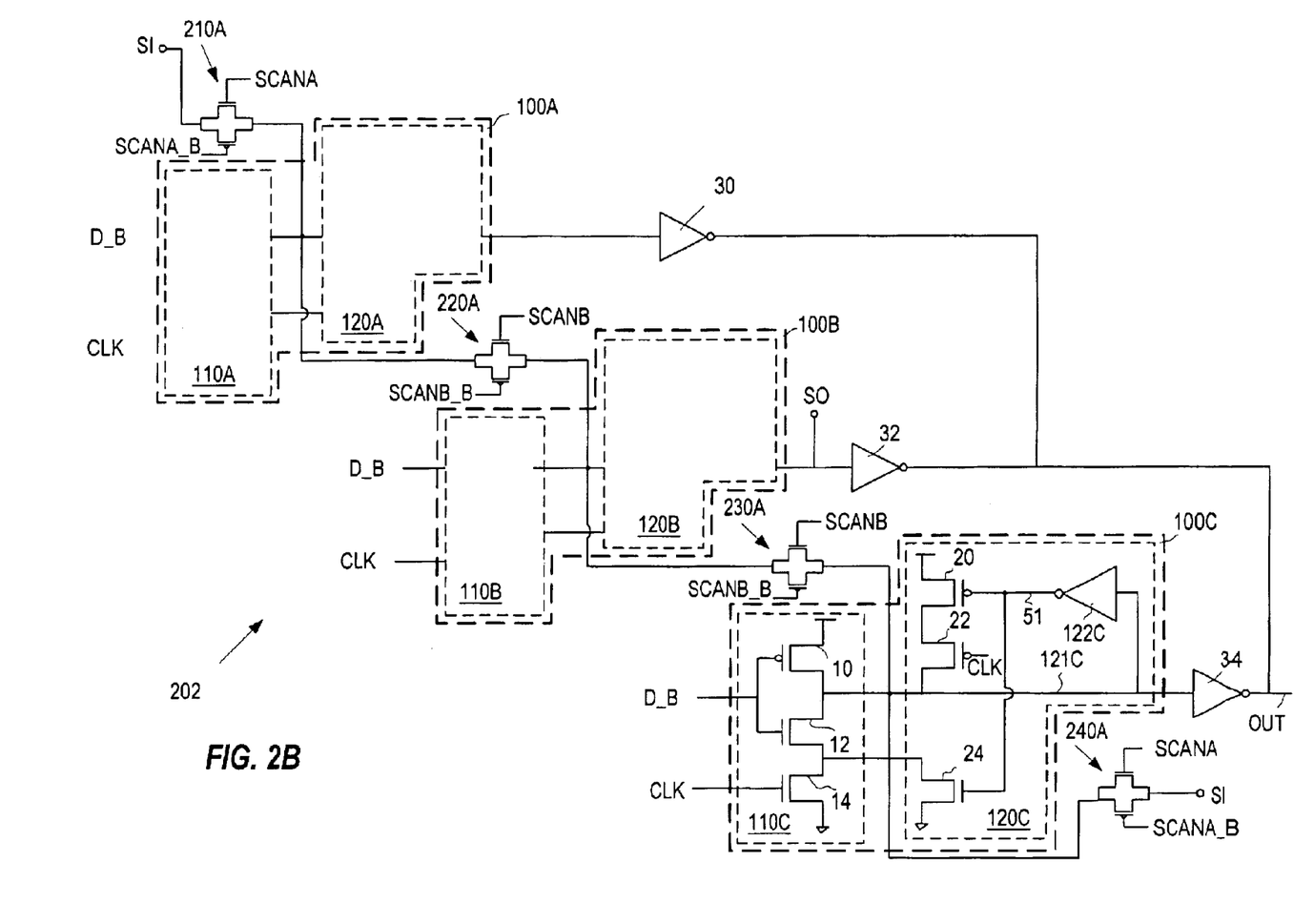

Referring now to FIG. 2B, latch 202 is shown, according to an embodiment of the present invention. Latch 202, like latch 201 of FIG. 6A, includes three domino sublatches 100A, 100B and 100C. In latch 202 the output node 121C is further isolated in order to more completely protect from radiation effects. (In latch 202, as in latch 201, the three sublatch circuits 100A, 100B are all the same and their internal details are shown for circuit 100C.) Sublatch circuits 100A, 1001B and 100C have their outputs connected in parallel to respective output inverters 30, 32 and 34. The output of sublatch 100B provides a scan output SO. (Inverters 30, 32 and 34 may be considered to be parts of sublatches 100A, 100B and 100C respectively, and may accordingly be referred to herein as output inverters of the respective sublatch 100A, 100B and 100C.) The inverters have their outputs tied together to provide the output node OUT for the latch circuit 202.

The latch 202 in FIG. 2B has the same arrangement of scanning-mode control switches as in latch 201 of FIG. 2A. That is, operation of latch 202 in scanning mode is like that of latch 201, and latch 202 has a first scanning-mode control switch 210B with one set of conducting electrodes of the set of FET's coupled to the latch node 121A of first sublatch 100A. The switch 210B receives a scan data input signal SI on the other set of conducting electrodes of the set of FET's and receives a first scanning control signal SCANA (and its complement SCANA_B) on the gates of the FET's.

The latch 202 also has a second scanning-mode control switch 220B that couples the first sublatch 100A node 121A conductively to the second sublatch 100B latch node 121B, according to a second scanning control signal SCANB and its complement SCANB_B asserted on the gates of the switch 220B. Likewise, the latch 202 has a third scanning-mode control switch 230B that couples the second sublatch 100B node 121B conductively to the third sublatch 100C latch node 121C, according to control signals SCANB and SCANB_B asserted on the gates of the switch 230B. And finally, the latch 202 has a fourth scanning-mode control switch 240B coupled to the latch node 121C of third sublatch 100C. The switch 240B or receives a scan data input signal SI and receives the first scanning control signal SCANA (and its complement SCANA_B) on the gates of its FET's. The switch 240B selectively transmits the scan data conductively to the node 121C, according to the control signals asserted on the gates of the switch 240B.

Figure 3A:
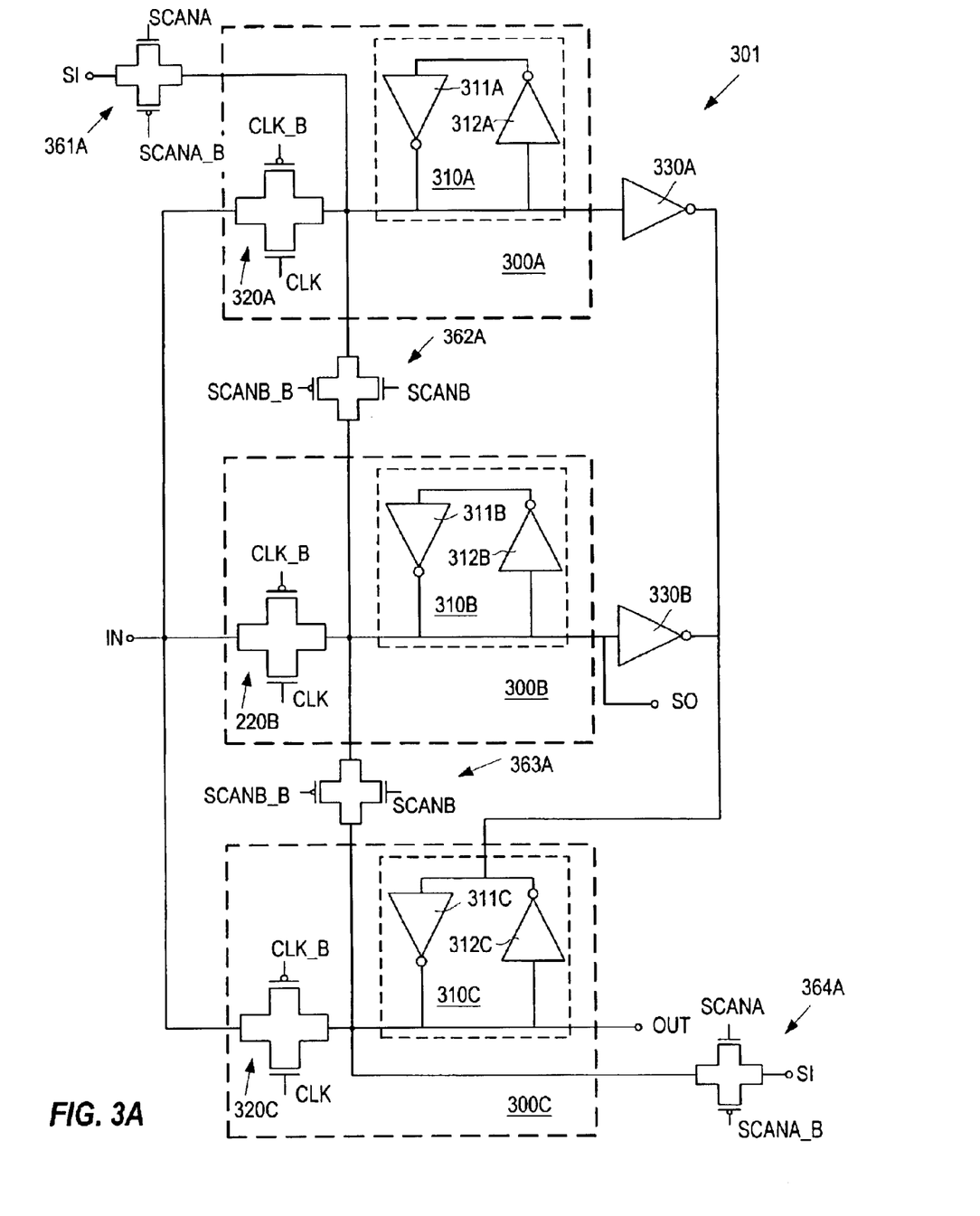
FIGS. 3A and 3B illustrate latch circuits of a memory cell type in which redundant sublatches are also interconnected for use as scanning sublatches, according to an embodiment of the present invention.

Referring now to FIG. 3A, a memory cell type latch 301 is illustrated according to an embodiment of the present invention. The latch 301 includes static sublatch circuits 300A, 300B and 300C. Sublatch circuits 300A, 300B and 300C in FIG. 3A are connected in parallel. All three circuits 300A, 300B and 300C have memory cells, 310A, 310B and 310C, coupled to pass gate pairs 320A, 320B and 320C respectively, which in turn are coupled to an input node IN for the latch 301 and controlled by a clock signal CLK and its complement CLK_B. Memory cells 310A, 310B and 310C have respective cross-coupled dual-inverters 311A and 312A, 311B and 312B, etc. The memory cells 310A and 310B of sublatches 300A and 300B are also coupled to respective output inverters 330A and 330B, which have their outputs coupled to feedback/feed forward node 313C of sublatch 300C. The latch 301 scanning output SO is at the input to inverter 330B. Sublatch 300C has no output inverter, and its memory cell 310C is thus coupled directly to the output node of sublatch 300C that provides the output node OUT for the overall latch 301. For sublatches 300A, 300B and 300C in FIG. 3A, the memory cells coupled to the respective sublatch output nodes provide feedback circuitry that serve to reinforce the output signals thereon.

Note that in general the inverters of the memory cells in latch 301 are not in series with the input node IN and output node OUT. Latch 301 does not have a common external inverter tied to the outputs of the sections 300A, 300B and 300C. Also, sublatches 300A and 300B isolate their memory cells 310A and 310B from the output node by inverters 330A and 330B.

The latch 301 in FIG. 3A has the same arrangement of scanning-mode control switches and operates in scanning mode in similar fashion as in the latches of FIGS. 2A and 2B. That is, the first, second, third and fourth scanning-mode control switches 361A through 364A for latch 301 interconnect external scanning data and the sublatches 300A, 300B and 300C as shown.

Figure 3B:
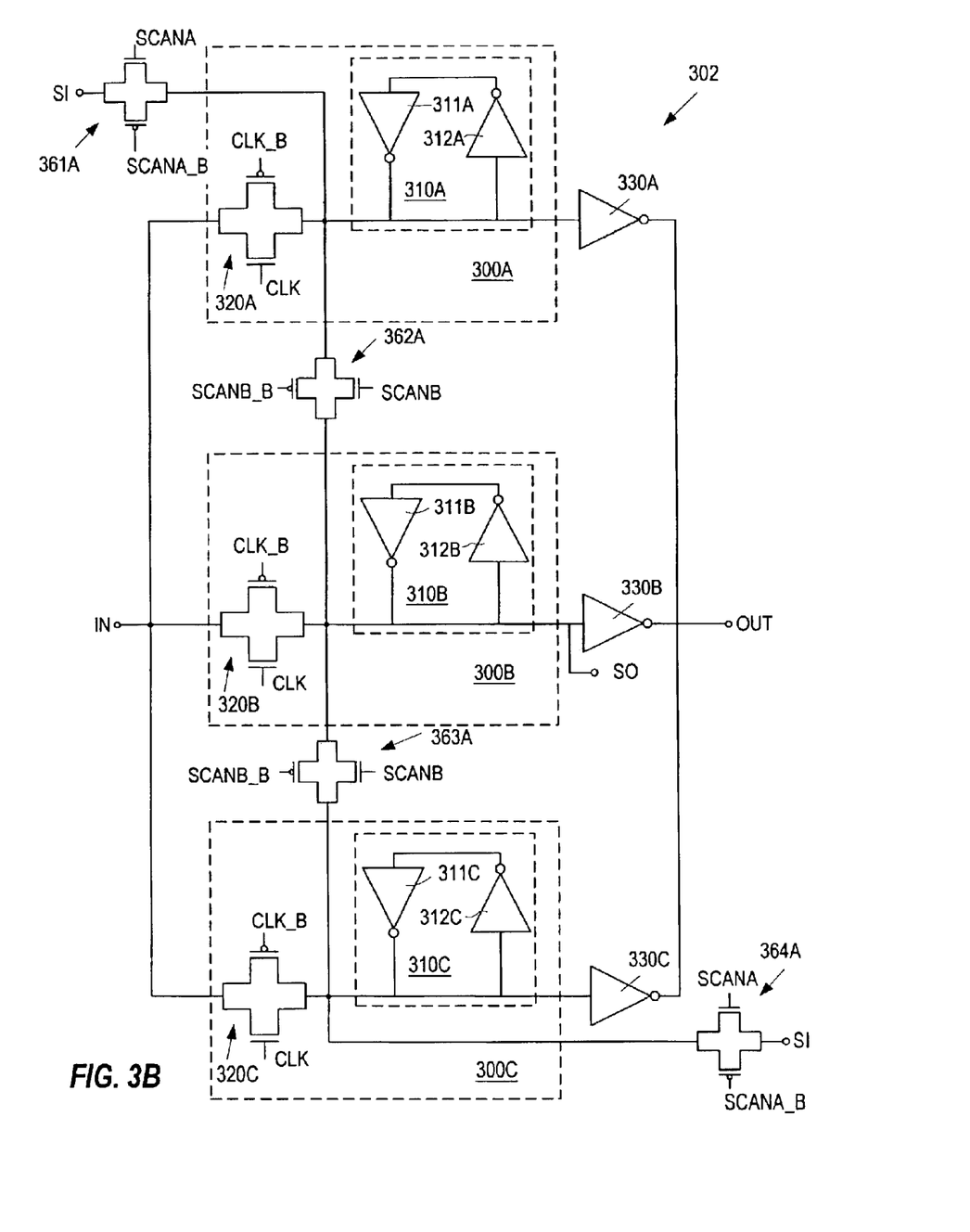

Referring now to FIG. 3B, a memory cell type latch 302 is illustrated according to an embodiment of the present invention. The latch 302 includes static sublatch circuits 300A, 300B and 300C. Note that in FIG. 3B the output node OUT is further isolated. That is, unlike in FIG. 3A, the memory cell 310C in FIG. 3B is coupled to an output inverter 330C which has its own output coupled to an output node OUT for the latch 302. For sublatches 300A, 300B and 300C of FIG. 3B, the memory cells 310A, 310B and 310C coupled to the respective sublatch output nodes provide feedback circuitry that serve to reinforce the output signals thereon. The latch 302 scanning output SO is at the memory cell 310B node connected to the input of inverter 330B.

As in FIG. 3A, the latch 302 of FIG. 3B has one node of each memory cell 310A, 3101B and 310C coupled to the respective input gates 320A, 320B and 320C. The same nodes of the memory cell 310A, 3101B and 310C are also coupled respective output inverters 330A, 330B and 330C, so that the inverters of the memory cells 310A, 310B and 310C are not in series with the input node In and output node OUT. Also as in latch 301 of FIG. 3A, latch 302 of FIG. 3B does not have a common external inverter tied to the outputs of the sections 300A, 300B and 300C. Also, memory cells 310A, 310B and 310C are advantageously isolated from the output node by inverters 330A, 330B and 330C.

The latch 302 in FIG. 3B has the same arrangement of scanning-mode control switches and operates in scanning mode in similar fashion as in the latches of FIGS. 2A and 2B. That is, the first, second, third and fourth scanning-mode control switches 361B through 364B for latch 302 interconnect external scanning data and the sublatches 300A, 300B and 300C as shown.

It should be appreciated that with the arrangements of FIGS. 2B and 3B, any circuit receiving the output of circuits 202 or 302 should be designed with a sufficiently insensitive switching point so that if any one of the latch nodes is subjected to a radiation induced erroneous change of state the voltage level to which the output node voltage consequently falls (or rises, as the case may be), i.e., the voltage at which the signals of the other two of the sublatch circuits hold the output node, is still above (or below) the switching point.

It should also be appreciated that with the arrangements of FIGS. 2B and 3B, the first and second sublatches are not coupled to the third sublatch by resistors, and that the first, second and third sublatches are not coupled to a common output inverter as in the prior art. It should also be appreciated that according to the latch of the present invention all the sublatches are used throughout both the scanning and normal modes of operation. That is, according to the latch of the present invention, and in contrast to the prior art, there is no sublatch like sublatch 170 in the latch 101 of FIG. 1 which holds scan data but does not participate in operation of the latch during the normal operation mode.

The above disclosure has been presented for purposes of illustration and is not intended to be exhaustive or to limit the invention to the form disclosed. A preferred embodiment has been disclosed. Many additional aspects, modifications and variations are also contemplated and are intended to be encompassed within the scope of the following claims.

What is claimed is:

1. A radiation resistant latch comprising:
    an output node;
    first, second and third sublatches,
        wherein the sublatches each have input circuitry, an output node coupled to the sublatch's input circuitry and feedback circuitry coupled to the sublatch's output node for reinforcing an output signal of the sublatch, and the sublatches are operable to receive a data signal at their respective input circuitry and responsively generate binary-state output signals on their respective output nodes, and
        wherein the output node of at least the third sublatch is coupled to the latch output node and the output nodes of the first and second sublatches are respectively connected in the latch such that if any one of the three sublatches is subjected to a radiation induced erroneous change of state, the output signals of the other two sublatches reduce an effect of the change on an overall output signal for the latch, providing improved radiation immunity; and
    a number of scanning-mode control switches coupled to ones of the sublatches for scanning data in to the latch.

2. The latch of claim 1, wherein the scanning-mode control switches comprise:
    a first scanning-mode control switch having a first conducting electrode coupled to the output node of one of the sublatches, a second conducting electrode for receiving scan data from a data source external to the latch, and a gate electrode for receiving a scanning control signal; and
    second and third scanning-mode control switches interconnecting the first sublatch output node to the second sublatch output node and the second sublatch output node to the third sublatch output node, respectively, the second and third scanning-mode control switches having respective gate electrodes arranged for receiving a different scanning control signal than that of the first scanning-mode control switch.

3. The latch of claim 1, wherein the scanning-mode control switches comprise:
    a first scanning-mode control switch having a first conducting electrode coupled to the output node of the first sublatch, a second conducting electrode coupled to the output node of the second sublatch, and a gate electrode for receiving a first scanning control signal; and
    a second scanning-mode control switch having a first conducting electrode coupled to the output node of the second sublatch, a second conducting electrode coupled to the output node of the third sublatch, and a gate electrode for receiving the first scanning control signal.

4. The latch of claim 3, wherein the scanning-mode control switches comprise:
   a third scanning-mode control switch having a first conducting electrode coupled to the output node of one of the sublatches, a second conducting electrode for receiving scan data from a data source external to the latch, and a gate electrode for receiving a second scanning control signal.

5. The latch of claim 4, wherein the first conducting electrode of the third scanning-mode control switch is coupled to the output node of the first or third one of the sublatches.

6. The latch of claim 5, wherein the first conducting electrode of the third scanning-mode control switch is coupled to the first one of the sublatches and the scanning-mode control switches comprise:
   a fourth scanning-mode control switch having a first conducting electrode coupled to the output node of the third one of the sublatches, a second conducting electrode coupled for receiving or transmitting scan data from or to a data source external to the latch, and a gate electrode for receiving a second instance of the control signal received by the third scanning-mode control switch.

7. The latch of claim 5, wherein the first conducting electrode of the third scanning-mode control switch is coupled to the third one of the sublatches and the scanning-mode control switches comprise:
   a fourth scanning-mode control switch having a first conducting electrode coupled to the output node of the first one of the sublatches, a second conducting electrode coupled for receiving or transmitting scan data from or to a data source external to the latch, and a gate electrode for receiving a second instance of the control signal received by the third scanning-mode control switch.

8. The latch of claim 2, wherein the first and second sublatches have their output nodes coupled to the latch output node.

9. The latch of claim 2, wherein the first and second sublatches have their output nodes coupled to the third sublatch's feedback circuitry.

10. The latch of claim 2, wherein the sublatches include domino sublatches.

11. The latch of claim 2, wherein the sublatches include static sublatches.

12. The latch of claim 6, wherein the first and second sublatches have their output nodes coupled to the latch output node.

13. The latch of claim 6, wherein the first and second sublatches have their output nodes coupled to the third sublatch's feedback circuitry.

14. The latch of claim 6, wherein the sublatches include domino sublatches.

15. The latch of claim 6, wherein the sublatches include static sublatches.

16. A radiation resistant latch comprising:
   an output node;
   first, second and third sublatches,
      wherein the sublatches each have input circuitry, an output node coupled to the sublatch's input circuitry and feedback circuitry coupled to the sublatch's output node for reinforcing an output signal of the sublatch, and the sublatches are operable to receive a data signal at their respective input circuitry and responsively generate binary-state output signals on their respective output nodes, and
      wherein the output node of at least the third sublatch is coupled to the latch output node and the output nodes of the first and second sublatches are respectively connected in the latch such that if any one of the three sublatches is subjected to a radiation induced erroneous change of state, the output signals of the other two sublatches reduce an effect of the change on an overall output signal for the latch, providing improved radiation immunity;
   a first scanning-mode control switch having a first conducting electrode coupled to the output node of the first sublatch, a second conducting electrode for receiving or transmitting scan data from or to a data source external to the latch, and a gate electrode for receiving a scanning control signal;
   second and third scanning-mode control switches interconnecting the first sublatch output node to the second sublatch output node and the second sublatch output node to the third sublatch output node, respectively, the second and third scanning-mode control switches having respective gate electrodes arranged for receiving a different scanning control signal than that of the first scanning-mode control switch;
   a fourth scanning-mode control switch having a first conducting electrode coupled to the output node of the third sublatch, a second conducting electrode coupled for receiving or transmitting scan data from or to a data source external to the latch, and a gate electrode for receiving a second instance of the control signal received by the first scanning-mode control switch, wherein the first and second sublatches have their output nodes coupled to the third sublatch's feedback circuitry and the sublatches include domino sublatches, wherein the first and second sublatches are not coupled to the third sublatch by resistors and the first, second and third sublatches are not coupled to a common output inverter.

17. A method of operating a radiation resistant latch, the method comprising the steps of:
   a) operating the latch in a normal mode of operation, including the steps of:
      a1) receiving a data signal at input circuitry of first, second and third sublatches and responsively generating binary-state sublatch output signals on output nodes of the respective sublatches;
      a2) feeding the output signal of the third sublatch to an output node for the overall latch; and
      a3) feeding the output signals of the first and second sublatches in the latch such that if any one of the three sublatches is subjected to a radiation induced erroneous change of state, the output signals of the other two sublatches reduce an effect of the change on an overall output signal for the latch in order to provide improved radiation immunity;
   b) operating the latch in a data scanning mode of operation, including the steps of:
      b1) turning on at least a first scanning-mode control switch in a first phase of a data scanning sequence, wherein turning on the first scanning-mode control switch conductively couples scanning data to one of the sublatch output nodes for holding the data during the first phase; and
      b2) turning on at least one other scanning-mode control switch in a second phase of the data scanning sequence, wherein turning on the at least one other scanning-mode control switch conductively shifts the scanning data to an output node of another one of the three sublatches.

18. The method of claim 17, wherein step b1) includes turning on, in the first phase of the data scanning sequence, the first scanning-mode control switch and a second scanning-mode control switch coupled respectively to the output nodes of the first and third sublatches, and step b2) includes turning on, in the second phase of the data scanning sequence, a third and fourth scanning-mode control switch respectively coupling the first and second sublatches and the third and second sublatches.

19. The method of claim 17, wherein b1) includes turning on, in the first phase of the data scanning sequence, the first scanning-mode control switch coupled to the output node of one of the first and third sublatches, and not turning on any scanning-mode control switch coupled to the other one of the first and third sublatches, and step b2) includes turning on, in the second phase of the data scanning sequence, a third and fourth scanning-mode control switch respectively coupling the first and second sublatches and the third and second sublatches.

20. The method of claim 17, wherein all the sublatches of the latch are used throughout both the scanning and normal modes of operation.

* * * * *